(12) United States Patent
Chu et al.

(10) Patent No.: US 11,023,012 B2
(45) Date of Patent: Jun. 1, 2021

(54) ELECTRONIC DEVICE HAVING A PLURALITY OF BODIES

(71) Applicants: Shu-Hsien Chu, Taipei (TW); Wang-Hung Yeh, Taipei (TW); Hsin-Chieh Fang, Taipei (TW); Jen-Yu Chiang, Taipei (TW)

(72) Inventors: Shu-Hsien Chu, Taipei (TW); Wang-Hung Yeh, Taipei (TW); Hsin-Chieh Fang, Taipei (TW); Jen-Yu Chiang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/596,759

(22) Filed: Oct. 9, 2019

(65) Prior Publication Data
US 2020/0117244 A1  Apr. 16, 2020

Related U.S. Application Data (60) Provisional application No. 62/744,624, filed on Oct. 11, 2018.

(51) Int. Cl.
| | |
|---|---|
| *G06F 1/16* | (2006.01) |
| *G06F 1/20* | (2006.01) |
| *H05K 5/03* | (2006.01) |

(52) U.S. Cl.
CPC ............ *G06F 1/1656* (2013.01); *G06F 1/165* (2013.01); *G06F 1/1618* (2013.01); *G06F 1/203* (2013.01); *H05K 5/03* (2013.01)

(58) Field of Classification Search
CPC ...... G06F 1/166; G06F 1/1656; G06F 1/1618; G06F 1/165; G06F 1/203; H05K 5/03
See application file for complete search history.

(56) References Cited

U.S. PATENT DOCUMENTS 8,842,425 B2 * 9/2014 Ryu ............... H04M 1/0268
                                                          361/679.27
8,922,995 B2 * 12/2014 Su ..................... H05K 5/0234
                                                          361/679.59

(Continued)

FOREIGN PATENT DOCUMENTS

| CN | 103914104 | 7/2014 |
|---|---|---|
| TW | I273878 | 2/2007 |

(Continued)

OTHER PUBLICATIONS

"Office Action of Taiwan Counterpart Application", dated May 20, 2020, p. 1-p. 8.

(Continued)

*Primary Examiner* — Rockshana D Chowdhury
*Assistant Examiner* — Douglas R Burtner
(74) *Attorney, Agent, or Firm* — JCIPRNET (57) ABSTRACT

An electronic device includes a first body, a first supporting member, and a second body. The first supporting member has a first end and a second end opposite to each other, and the first end is pivoted at the first body. The second body has a notch, the second end is pivoted at the second body, and the first supporting member is fitted to the notch. The second body and the first supporting member fitted to the notch are closed or opened up with respect to the first body together as the first supporting member is pivotally rotated relative to the first body. When the second body is opened up, the second body and the first supporting member are pivotally rotated relatively to separate the first supporting member from the notch and move a bottom end of the second body to a preset position on the first body.

15 Claims, 12 Drawing Sheets

(56) References Cited

U.S. PATENT DOCUMENTS

| | | | | |
|---|---|---|---|---|
| 9,030,813 | B2* | 5/2015 | Chang | G06F 1/1633 361/679.27 |
| 2005/0272483 | A1* | 12/2005 | Ko | F16M 11/10 455/575.1 |
| 2009/0160777 | A1* | 6/2009 | Liu | H01H 13/86 345/169 |
| 2011/0091051 | A1* | 4/2011 | Thomason | G06F 1/1688 381/103 |
| 2013/0095925 | A1* | 4/2013 | Xu | G06F 1/169 463/37 |
| 2014/0139982 | A1* | 5/2014 | Kuo | G06F 1/1637 361/679.01 |
| 2014/0160654 | A1* | 6/2014 | Yoo | G06F 1/1681 361/679.12 |
| 2015/0085433 | A1* | 3/2015 | Kim | G06F 1/1624 361/679.01 |
| 2015/0091509 | A1* | 4/2015 | Zhou | H01F 38/14 320/108 |
| 2018/0129249 | A1* | 5/2018 | Ko | G06F 1/1681 |
| 2019/0286191 | A1* | 9/2019 | Correll, Jr. | H04M 1/0266 |
| 2019/0334114 | A1* | 10/2019 | Park | G06F 1/1652 |
| 2020/0033921 | A1* | 1/2020 | Rohena | H05K 7/20209 |

FOREIGN PATENT DOCUMENTS

| | | | |
|---|---|---|---|
| TW | 201239588 | 10/2012 | |
| TW | 201428454 | 7/2014 | |
| TW | I516898 | 1/2016 | |
| TW | M539080 U | * 1/2017 | G06F 1/16 |
| TW | M539080 | 4/2017 | |

OTHER PUBLICATIONS

"Office Action of Taiwan Counterpart Application", dated Oct. 20, 2020, p. 1-p. 8.

* cited by examiner

ELECTRONIC DEVICE HAVING A PLURALITY OF BODIES

CROSS-REFERENCE TO RELATED APPLICATION

This application claims the priority benefit of U.S. provisional application Ser. No. 62/744,624, filed on Oct. 11, 2018. The entirety of the above-mentioned patent application is hereby incorporated by reference herein and made a part of this specification.

BACKGROUND DISCLOSURE

Technical Field

The disclosure relates to an electronic device, and in particular, to an electronic device having a plurality of bodies.

Description of Related Art

Notebook computers have remained popular in the consumer market for a long time. In addition to being used by ordinary consumers, notebook computers may also provide a professional drawing function through a display that has a touch function. In order to allow a user to comfortably perform a touch drawing operation on a display surface of the display, the displays of some notebook computers are designed to be able to slide toward the user relative to a host, and the inclination angle of the display may also be changed for a drawing mode. With such design concept, it requires a supporting structure to support the display in the drawing mode on the host. However, disposing the supporting structure may increase the thickness of the entire structure of the notebook computer, and goes against the trend of pursuing a light and thin design.

SUMMARY

The disclosure provides an electronic device to prevent an excessive increase in a thickness of an entire structure due to disposing of a supporting member.

The electronic device of the disclosure includes a first body, a first supporting member, and a second body. The first supporting member includes a first end and a second end that are opposite to each other, and the first end of the first supporting member is pivoted at the first body. The second body has a notch, the second end of the first supporting member is pivoted at the second body, and the first supporting member is adapted to be fitted to the notch. The second body and the first supporting member fitted to the notch are adapted to be closed or opened up with respect to the first body together as the first supporting member is pivotally rotated relative to the first body. When the second body is opened up with respect to the first body, the second body and the first supporting member are adapted to be pivotally rotated relative to each other to separate the first supporting member from the notch and move a bottom end of the second body to a preset position on the first body.

In an embodiment of the disclosure, the second end of the foregoing first supporting member is pivoted at an inner edge of the notch.

In an embodiment of the disclosure, the foregoing second body includes a front face and a back face that are opposite to each other, and the notch penetrates from the front face to the back face.

In the electronic device according to claim 1, the first end of the first supporting member is pivoted at a pivot of the first body, and when the first supporting member is fitted to the notch, a bottom end of the second body adjoins the pivot.

In an embodiment of the disclosure, the foregoing second body includes a display surface, the display surface includes a main display area and an auxiliary display area, and the auxiliary display area is connected to the notch and extends along an edge of the main display area.

In an embodiment of the disclosure, the foregoing electronic device includes a second supporting member. The second supporting member includes a third end and a fourth end that are opposite to each other. The third end of the second supporting member is pivoted at the first body, and the fourth end of the second supporting member is pivoted at the second body. The second body includes a groove, and the second supporting member is adapted to be fitted to the groove. The second body and the second supporting member that is fitted to the groove are adapted to be closed or opened up with respect to the first body as the second supporting member is pivotally rotated relative to the first body. When the second body is opened up with respect to the first body, the second body and the second supporting member are adapted to be pivotally rotated relative to each other to the second supporting member from the groove and move the bottom end of the second body to a preset position.

In an embodiment of the disclosure, a thickness of the foregoing second supporting member is less than a thickness of the first supporting member.

In an embodiment of the disclosure, the foregoing second body includes a side end. The side end is connected to the bottom end, and the notch is formed at a corner of the second body and located between the side end and the bottom end.

In an embodiment of the disclosure, the foregoing first body includes a positioning portion. When the bottom end of the second body is located at the preset position, the bottom end is positioned at the positioning portion.

In an embodiment of the disclosure, the foregoing positioning portion includes a slot, and the bottom end is adapted to be inserted into the slot.

In an embodiment of the disclosure, the foregoing electronic device includes at least one engagement member. The at least one engagement member is movably configured within the slot. The second body includes at least one engagement slot at the bottom end, and the bottom end of the second body is adapted to stretch into the slot and abut against at least one engagement member to drive the at least one engagement member to engage with the at least one engagement slot.

In an embodiment of the disclosure, the foregoing electronic device includes a cover. The cover is slidably disposed at the first body and covers the positioning portion, and the cover is adapted to be pushed to expose the positioning portion.

In an embodiment of the disclosure, the foregoing cover includes a touch display interface.

In an embodiment of the disclosure, when the cover is pushed to expose the positioning portion, a display mode of the touch display interface changes.

In an embodiment of the disclosure, the foregoing electronic device includes a heat-dissipation module. The heat-dissipation module is configured within the first body. When the cover is pushed to expose the positioning portion, an operating mode of the heat-dissipation module changes.

Based on the foregoing, in the electronic device of the disclosure, the second body includes a notch corresponding to the first supporting member, and therefore the first supporting member may be fitted to the notch of the second body, and the thickness of the entire structure is not excessively increased due to disposing of the first supporting member.

DESCRIPTION OF THE EMBODIMENTS

Figure 1:
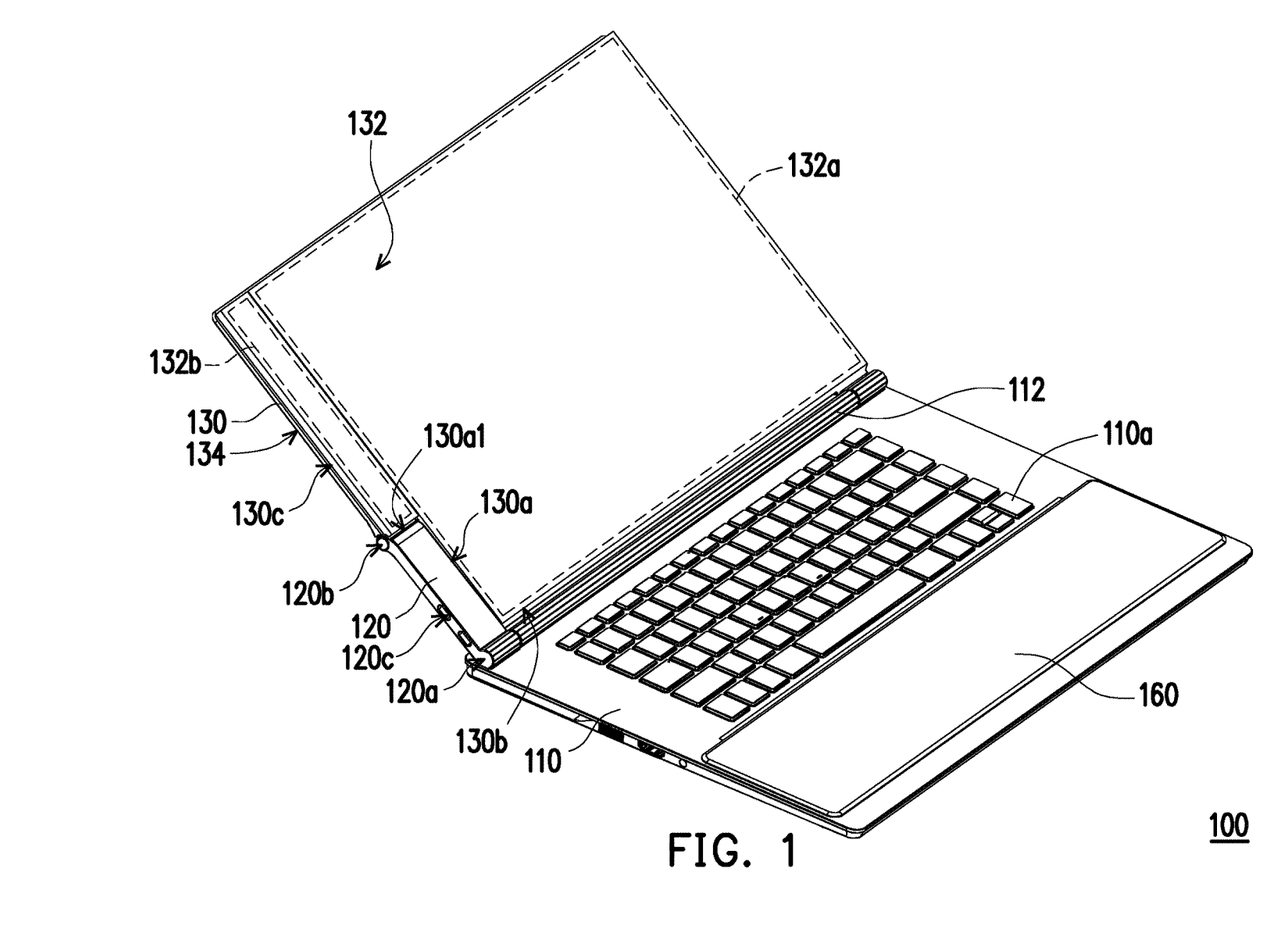
FIG. 1 is a three-dimensional view of an electronic device according to an embodiment of the disclosure.
Figure 2:
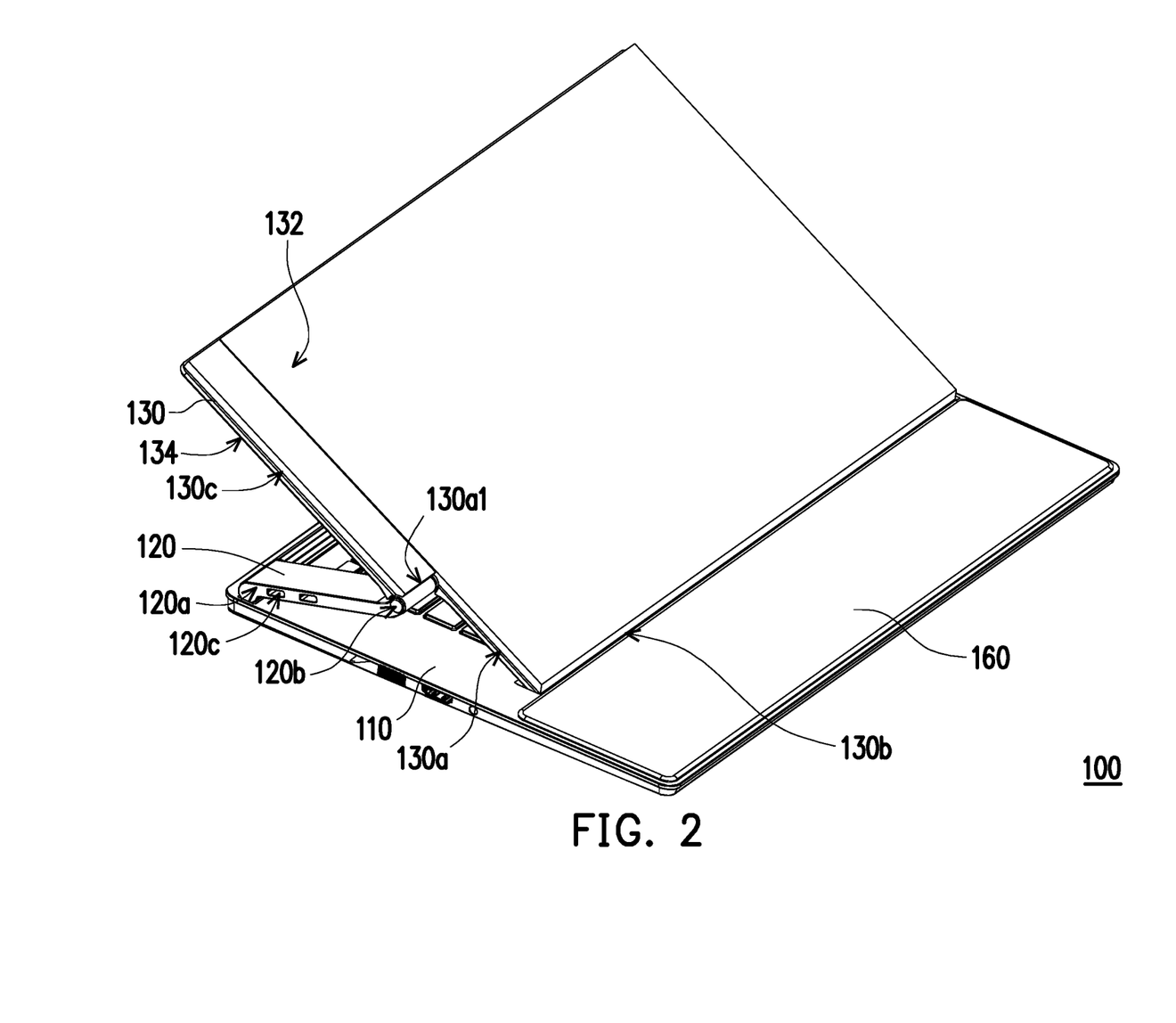
FIG. 2 shows a second body of FIG. 1 that is converted into another operating state.

FIG. 1 is a three-dimensional view of an electronic device according to an embodiment of the disclosure. FIG. 2 shows a second body of FIG. 1 that is converted into another operating state. Referring to FIG. 1 and FIG. 2, the electronic device 100 in the present embodiment is, for example, a notebook computer and includes a first body 110, a first supporting member 120, and a second body 130. The first body 110 is, for example, a host of the notebook computer and has an input interface 110a (such as a keyboard), and the second body 130 is, for example, a display of the notebook computer. The first supporting member 120 has a first end 120a and a second end 120b that are opposite to each other. The first end 120a is pivoted at a pivot 112 of the first body 110, and the second end 120b is pivoted at the second body 130.

In the present embodiment, the second body 130 has a front face 132 and a back face 134 that are opposite to each other, and has a bottom end 130b and a side end 130c that are connected to each other. The second body 130 further has a notch 130a, and the notch 130a is formed at a corner of the second body 130 and located between the side end 130c and the bottom end 130b. The first supporting member 120 is pivoted at an inner edge 130a1 of the notch 130a and is adapted to be fitted to the notch 130a as shown in FIG. 1. When the first supporting member 120 is fitted to the notch 130a, the bottom end 130b of the second body 130 adjoins a pivot 112 of the first body 110.

The second body 130 and the first supporting member 120 that is fitted to the notch 130a are adapted to be closed or opened up with respect to the first body 110 together as the first supporting member 120 is pivotally rotated relative to the first body 110 (FIG. 1 shows that the second body 130 and the first supporting member 120 are opened up with respect to the first body 110). In addition, when the second body 130 is opened up with respect to the first body 110, the second body 130 and the first supporting member 120 are adapted to be pivotally rotated relative to each other. As shown in FIG. 2, the first supporting member 120 is separated from the notch 130a, and a bottom end 130b of the second body 130 is moved to a preset position on the first body 110.

The front face 132 of the second body 120 is, for example, a display surface with a touch function. In a state shown in FIG. 2, the display surface (the front face 132) of the second body 120 is closer to a user and has an appropriate inclination angle, so that the user can comfortably perform a touch operation (such as drawing through touch) on the display surface. In addition, because the second body 130 has the notch 130a corresponding to the first supporting member 120 as described above, the first supporting member 120 may be fitted to the notch 130a of the second body 130 as shown in FIG. 1 or FIG. 2, and a thickness of an entire structure is not excessively increased due to disposing of the first supporting member 120.

Figure 3:
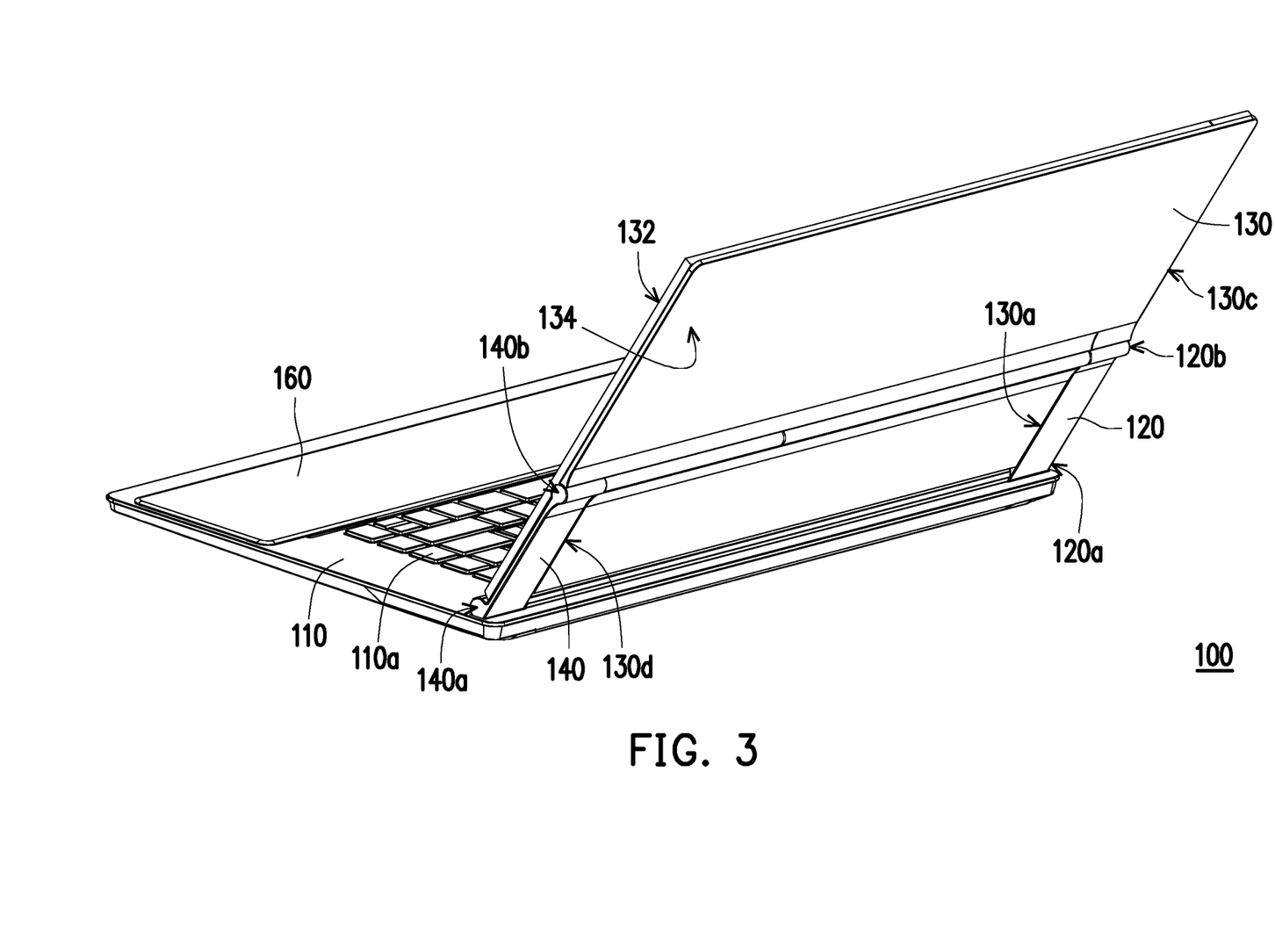
FIG. 3 is a three-dimensional view of the electronic device of FIG. 1 from another perspective.
Figure 4:
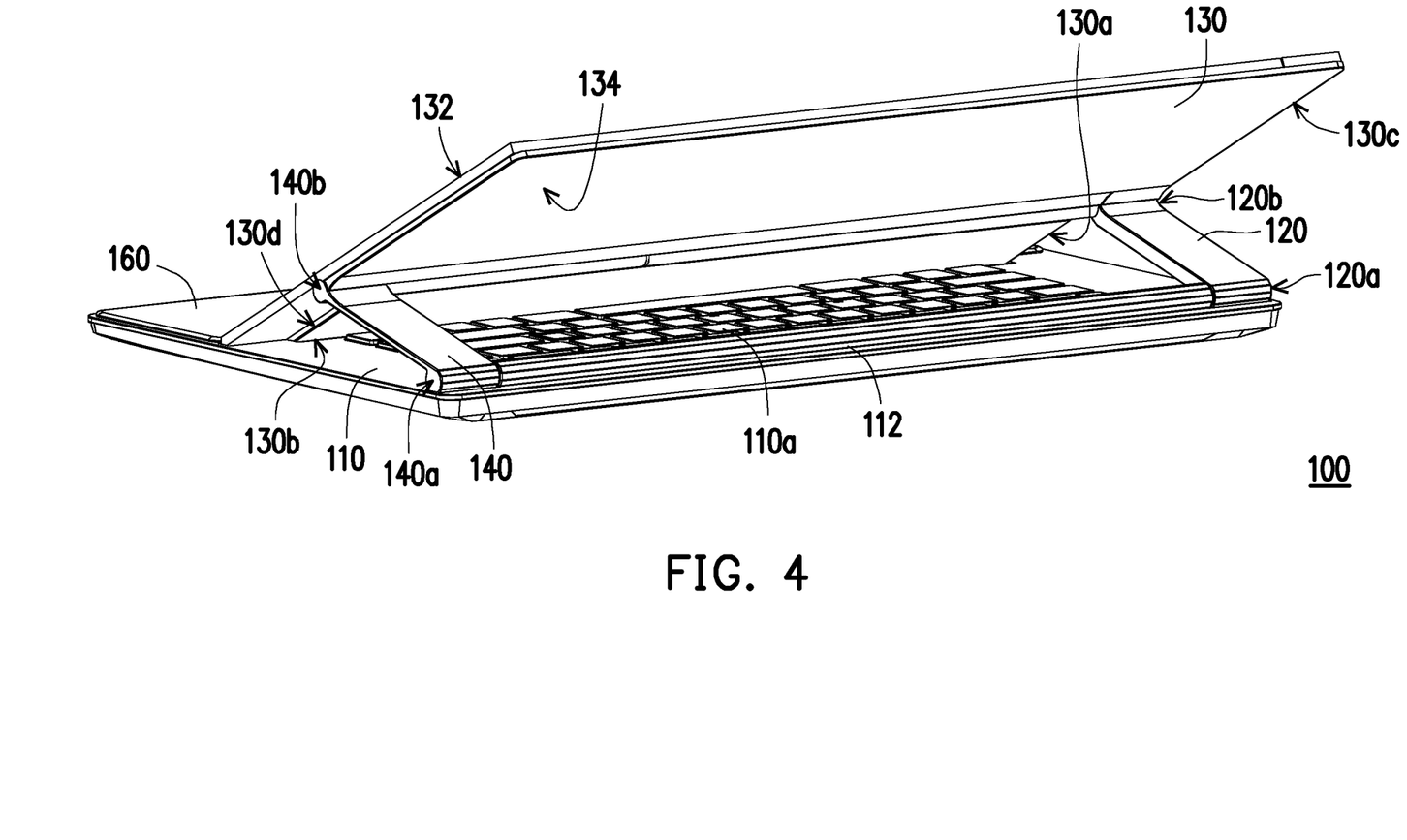
FIG. 4 is a three-dimensional view of the electronic device of FIG. 2 from another perspective.

FIG. 3 is a three-dimensional view of an electronic device of FIG. 1 from another perspective. FIG. 4 is a three-dimensional view of an electronic device of FIG. 2 from another perspective. Referring to FIG. 3 and FIG. 4, the electronic device 100 of the present embodiment further includes a second supporting member 140, and the first supporting member 120 and the second supporting member 140 are, for example, respectively disposed at two opposite sides of the second body 130 to jointly support the second body 130. In particular, the second supporting member 140 has a third end 140a and a fourth end 140b that are opposite to each other. The third end 140a is pivoted at a pivot 112 of the first body 110, and the fourth end 140b is pivoted at the second body 130. The second body 130 has a groove 130d, and the second supporting member 140 is adapted to be fitted to the groove 130d as shown in FIG. 3.

The second body 130 and the second supporting member 140 that is fitted to the groove 130d are adapted to be closed or opened up with respect to the first body 110 together as the second supporting member 140 is pivotally rotated relative to the first body 110 (FIG. 3 shows that the second body 130 and the second supporting member 140 are opened up with respect to the first body 110). In addition, when the second body 130 is opened up with respect to the first body 110, the second body 120 and the second supporting member 140 are adapted to be pivotally rotated relative to each other to separate the second supporting member 140 from the groove 130d as shown in FIG. 4, and move the bottom end 130b of the second body 130 to the preset position. It should be noted that the first end 120a of the first supporting member 120 and the third end 140a of the second supporting member 140 are coaxially arranged, and a second end 120b of the first supporting member 120 and a fourth end 140b of the second supporting member 140 are coaxially arranged. During the second body 130 is operated as described above, the first supporting member 120 and the second supporting member 140 are pivotally rotated synchronously.

In the present embodiment, the notch 130a of the second body 130 penetrates from the front face 132 to the back face 134, and therefore enough space is provided to accommodate the first supporting member 120, so that a thickness of the first supporting member 120 may be at least the same as a thickness of the second body 130, and the thickness of the entire structure is not additionally increased. Accordingly, the first supporting member 120 may have relative good structure strength by means of the enough thickness thereof, and therefore the second supporting member 140 can also provide enough supporting strength together with the first supporting member 120 when the thickness of the second supporting member 140 is less than the thickness of the first supporting member 120, so that the entire structure has a relatively small thickness. In addition, because the first supporting member 120 has a relatively large thickness as described above, various electrical interfaces 120c (such as a Micro USB slot, a Type-C slot, or electrical slots of other types) may be additionally disposed on the first supporting member 120 as required. In this way, when the electrical interface is also disposed at a side face of the first body 110, a quantity of electrical interfaces may be increased to improve expandability. In addition, a heat-dissipation opening may be also disposed at the side face of the first body 110 to improve heat-dissipation efficiency.

Referring to FIG. 1, the display surface (the front face 132) of the second body 130 of the present embodiment includes a main display area 132a and an auxiliary display area 132b. The auxiliary display area 132b is connected to the notch 130a and extends along an edge of the main display area 132a. The main display area 132a may be used to display a main picture, and the auxiliary display area 132b may be used to display time, a network connection state, toolbars, or other auxiliary information. Therefore, picture information on the main display area 132a may be prevented from being cut or occupied by the toolbars, toolbar buttons, or a system state. In addition, a lens of a camera of the electronic device 100 may be configured in the auxiliary display area 132b, and the lens is not required to be configured in a frame area of the main display area 132a, so as to narrow frames of the main display area 132a. In other embodiments, the lens is configured in the auxiliary display area 132b and away from an inner edge 130a1 of the notch 130a, that is, configured at a position that is above the notch 130a and away from the bottom end 130b, so as to provide a relatively high shooting angle and obtain a better shooting picture.

Figure 5A:
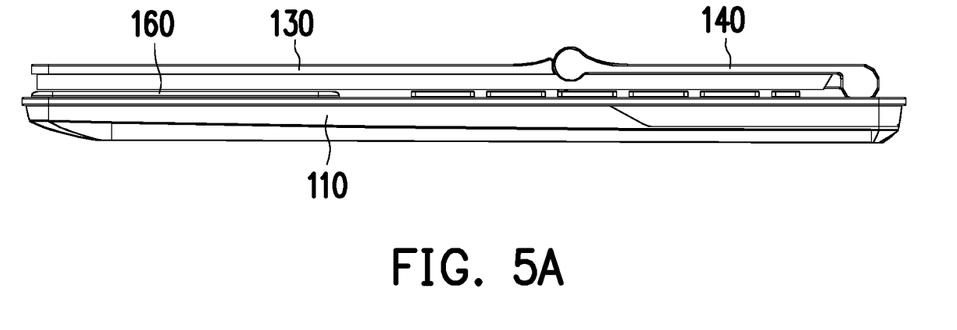
FIG. 5A to FIG. 5E show an operating process of the electronic device of FIG. 1.
Figure 5B:
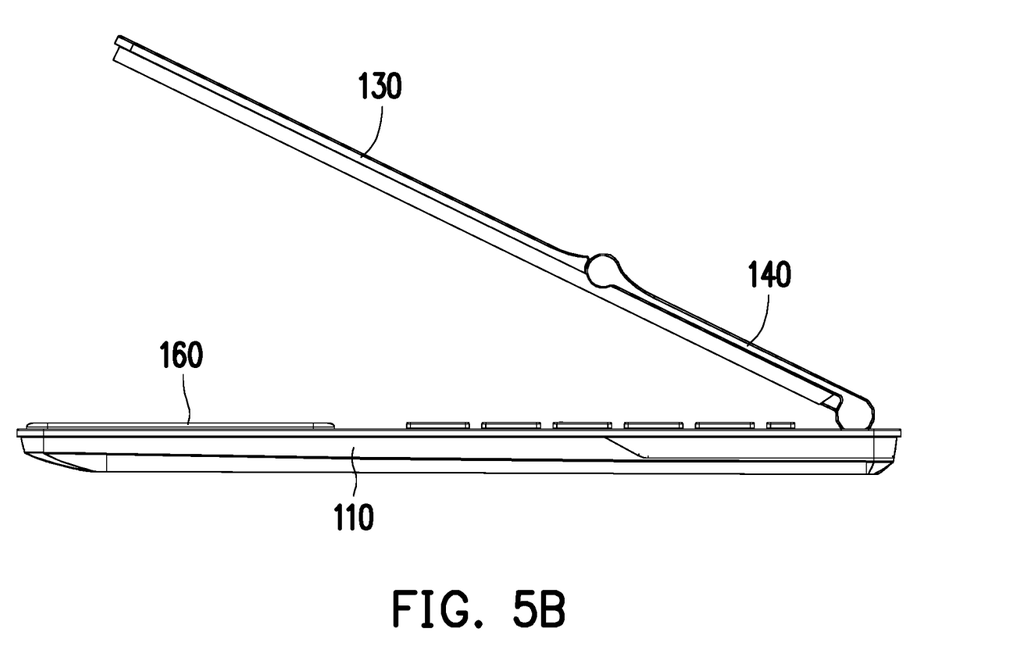
Figure 5C:
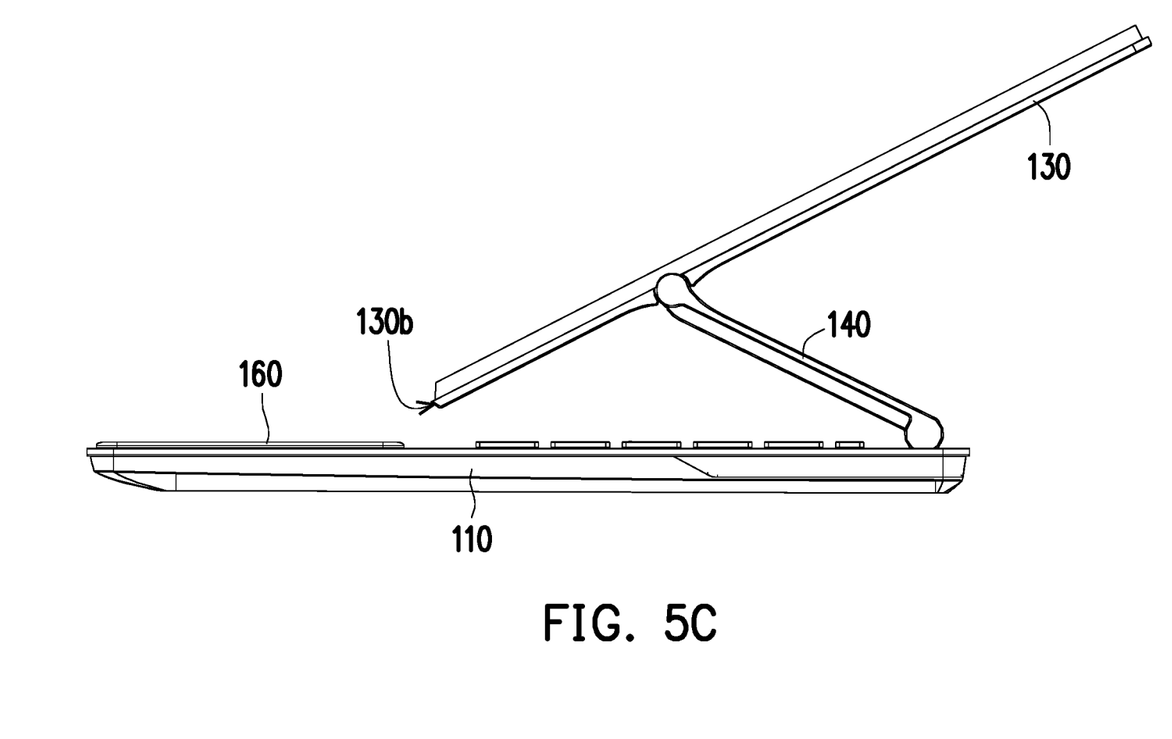
Figure 5D:
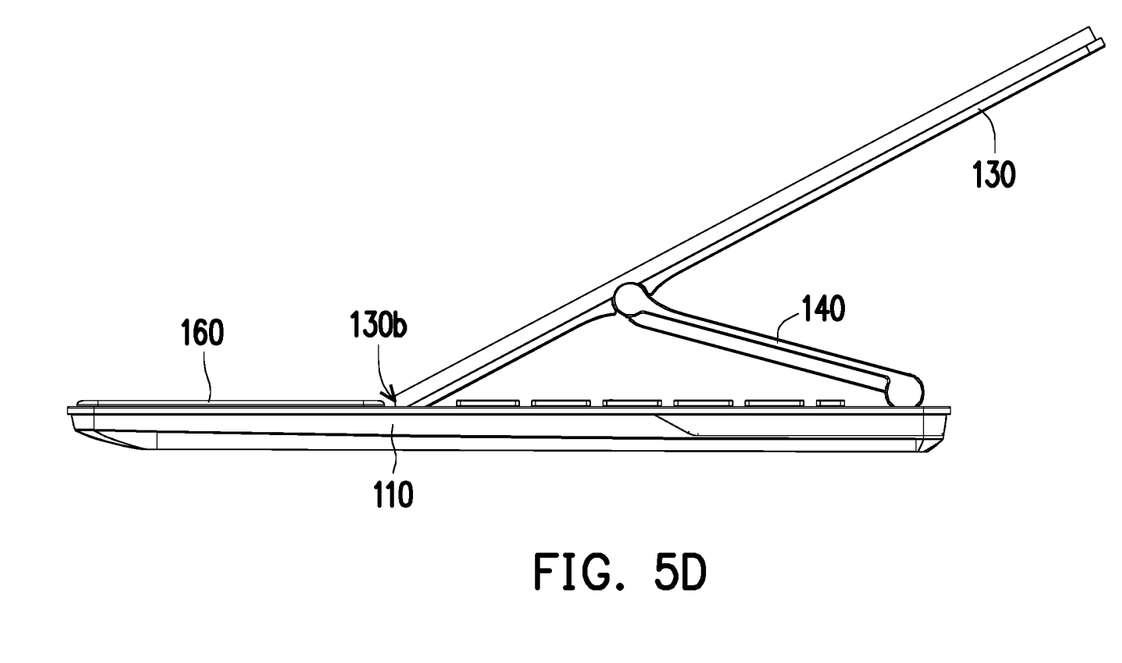
Figure 5E:
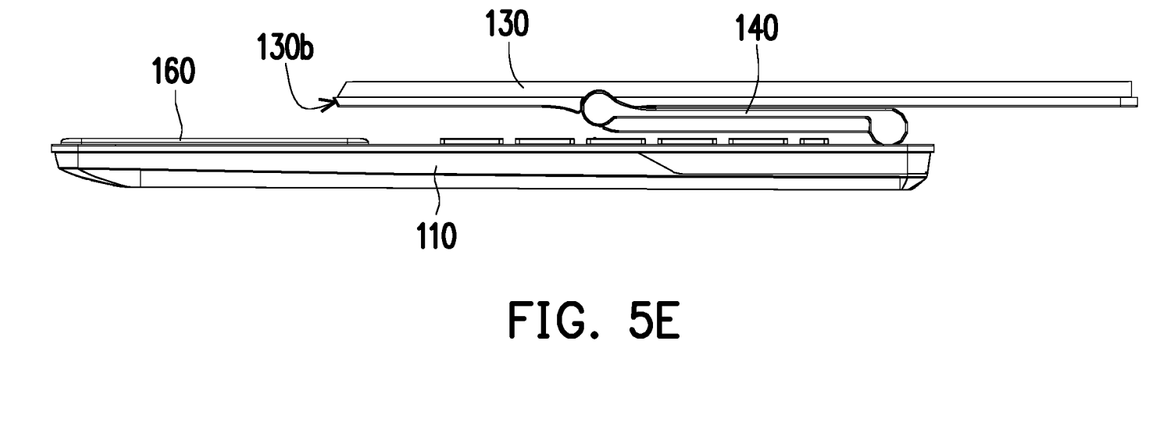

A detailed operation process of the electronic device of the present embodiment is described below through drawings. The operation process of the electronic device in FIG. 1 are shown in FIG. 5A to FIG. 5E. FIG. 5A to FIG. 5E show a second supporting member 140 without showing a first supporting member 120 due to a viewing angle. If a user intends to convert the second body 130 that is shown in FIG. 5 and that is closed with respect to the first body 110 into states shown in FIG. 2 and FIG. 4, as shown in FIG. 5B, the second body 130 may be first opened up at an appropriate angle relative to the first body 110, and then, as shown in FIG. 5C, the second body 130 is enabled to rotate relative to the first supporting member 120 (as shown in FIG. 1 to FIG. 4) and the second supporting member 140. Next, as shown in FIG. 5D, the bottom end 130b of the second body 130 is engaged with the first body 110, so that the second body 130 is in states shown in FIG. 2 and FIG. 4. In addition, the second body 130 shown in FIG. 5D may further be close to the first body 110 as shown in FIG. 5E, so that the electronic device 100 is in an operating mode of a tablet computer.

Figure 6:
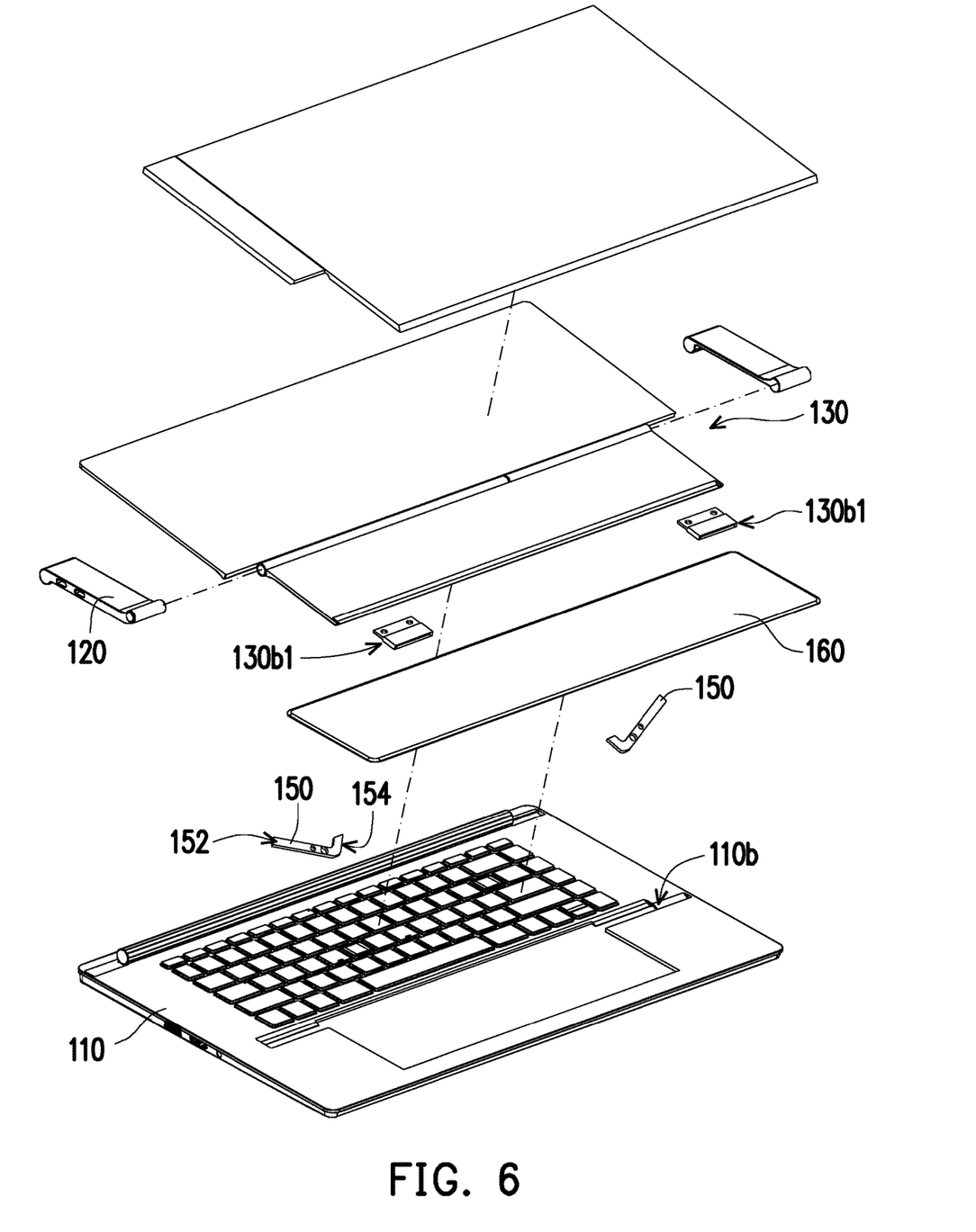
FIG. 6 is an exploded view of some members of the electronic device of FIG. 2.
Figure 7A:
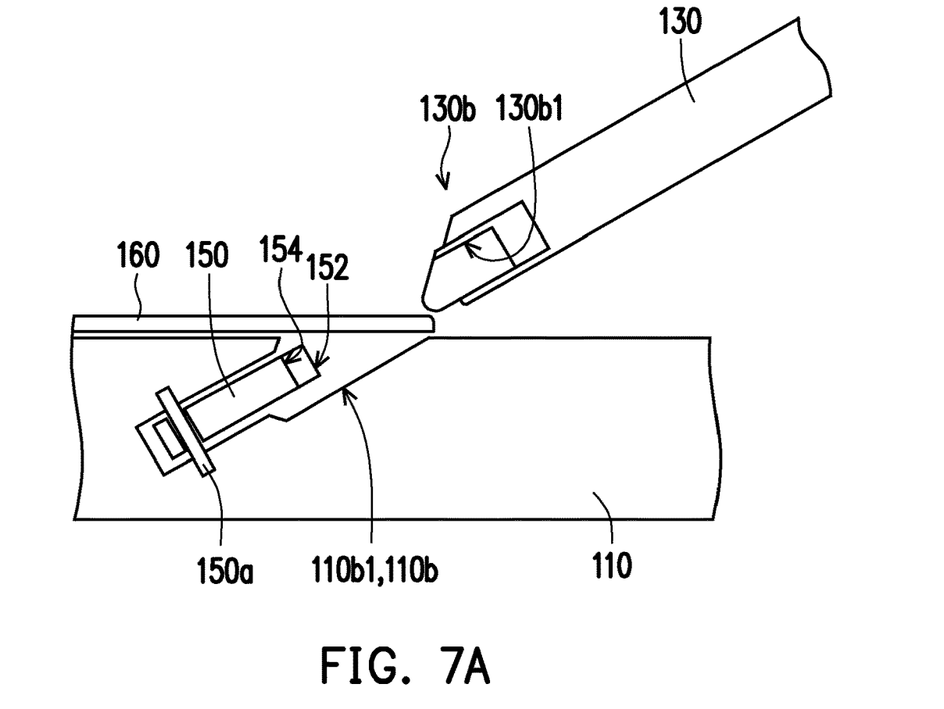
FIG. 7A to FIG. 7C show an operating process of a second body and an engagement member of FIG. 6.
Figure 7B:
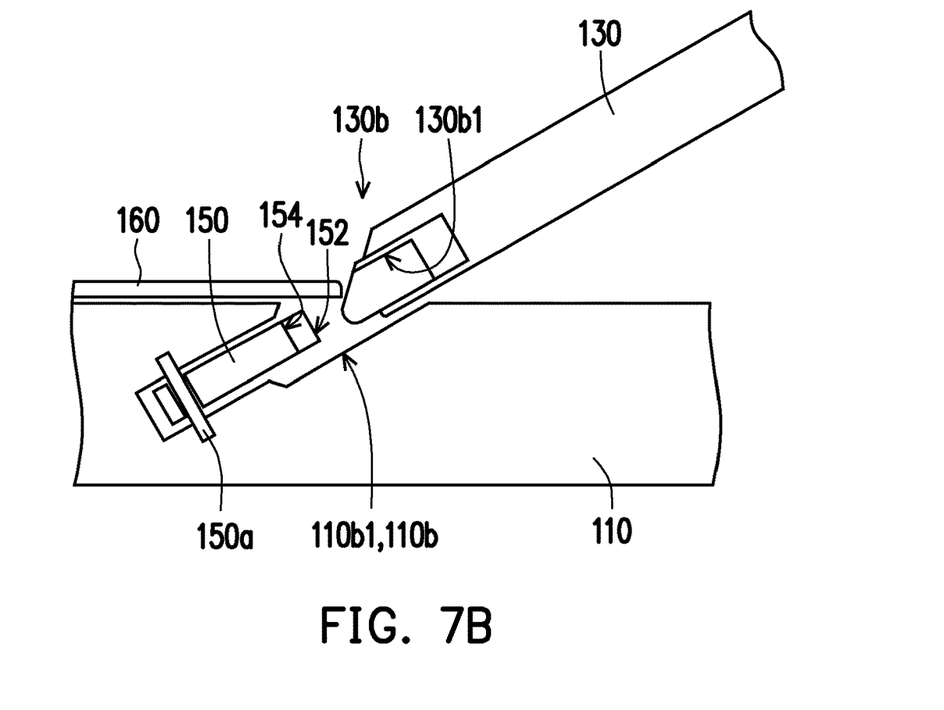
Figure 7C:
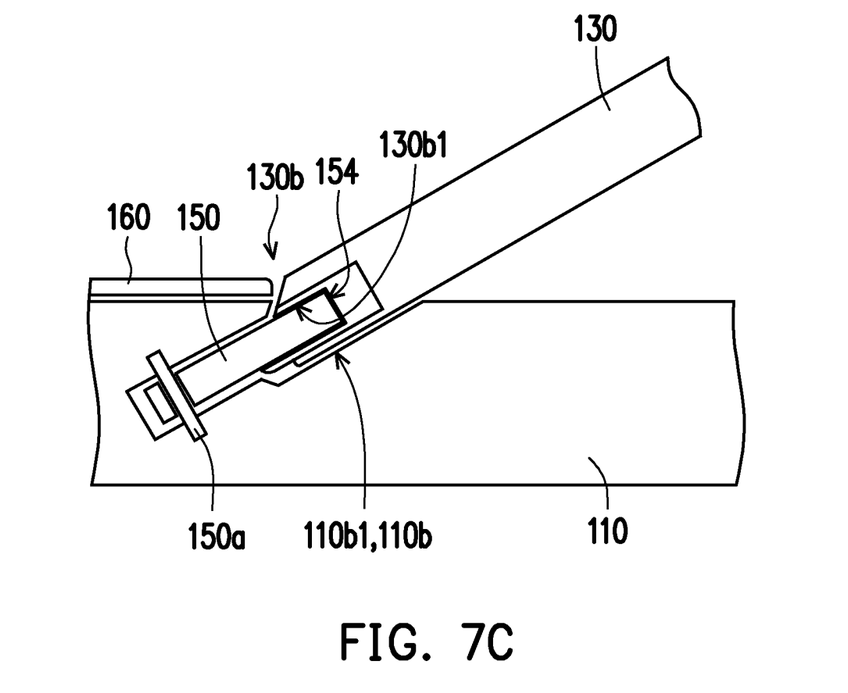

A manner in which the bottom end 130b of the second body 130 is engaged with the first body 110 is described in detail as follows through drawings. FIG. 6 is an exploded view of some members of an electronic device of FIG. 2. FIG. 7A to FIG. 7C show an operating process of a second body and an engagement member of FIG. 6. As shown in FIG. 6 and FIG. 7, the first body 110 of the present embodiment has a positioning portion 110b, the positioning portion 110b including a slot 110b1. When a bottom end 130b of the second body 130 reaches the preset position on the first body 110, the bottom end 130b is adapted to be inserted into the slot 110b1 and positioned at the positioning portion 110b as shown in FIG. 7A to FIG. 7C. In particular, the electronic device 100 further includes at least one engagement member 150 (two are shown in FIG. 6). The engagement member 150 is movably configured within the slot 110b1. The second body 130 has at least one engagement slot 130b1 (two are shown in FIG. 6) at the bottom end 130b. The bottom end 130b of the second body 130 is adapted to stretch into the slot 110b1 and abut against the engagement member 150 as shown in FIG. 7B to FIG. 7C to drive the engagement member 150 to engage with the engagement slot 130b1. With an engagement force provided through engagement between the engagement member 150 and the engagement slot 130b1, the second body 130 may be effectively prevented from unexpectedly sliding and falling due to an external force, so that the second body 130 is adapted to carry a touch function.

In the present embodiment, the engagement member 150 is, for example, adapted to be rotatably disposed at the first body 110 through a rotating shaft 150a (marked in FIG. 7A to FIG. 7C). The bottom end 130b of the second body 130 is adapted to push an end 154 of the engagement member 150 to drive the engagement member 150 to rotate, so that another end 152 of the engagement member 150 is snapped into the engagement slot 130b1. In other embodiments, the bottom end 130b of the second body 130 may be engaged with the positioning portion 110b of the first body 110 through other appropriate structures, which is not limited in the disclosure.

In addition, the electronic device 100 of the present embodiment further includes a cover 160. The cover 160 is slidably disposed at the first body 110 and adapted to cover the positioning portion 110b. When the bottom end 130b of the second body 130 is moved to the preset position on the first body 110, the cover 160 is pushed to expose the positioning portion 110b as shown in FIG. 7A to FIG. 7C, so that the bottom end 130b of the second body 130 can be engaged with the positioning portion 110b as described above. In the present embodiment, the cover 160 is, for example, pushed by a hand of the user to be moved from a position as shown in FIG. 7A to a position as shown in FIG. 7C. However, in other embodiments, the second body 130 may be pushed by the second body 130 to be moved from the position shown in FIG. 7A to the position shown in FIG. 7C, which is not limited in the disclosure.

In the present embodiment, the cover 160 is, for example, a touch display interface for the user to perform touch input. When the cover 160 is pushed to expose the positioning portion 110b, a display mode of the touch display interface is changed as being switched. For example, the display mode of the touch display interface may be changed into an auxiliary drawing mode via switching to display an auxiliary function required for a drawing operation. Accordingly, an operating interface for controlling the switching is not required to be additionally displayed in the main display area 132a of the second body 130, to prevent picture information of the main display area 132a from being excessively cut or occupied. In other embodiments, the display mode of the touch display interface may be changed into other appropriate modes through the switching, which is not limited in the disclosure. For example, the switching is performed in this manner: the cover 160 is moved to trigger a switch that is disposed at an appropriate position of the first body 110, or performed in other manners, which is not limited in the disclosure.

Figure 8:
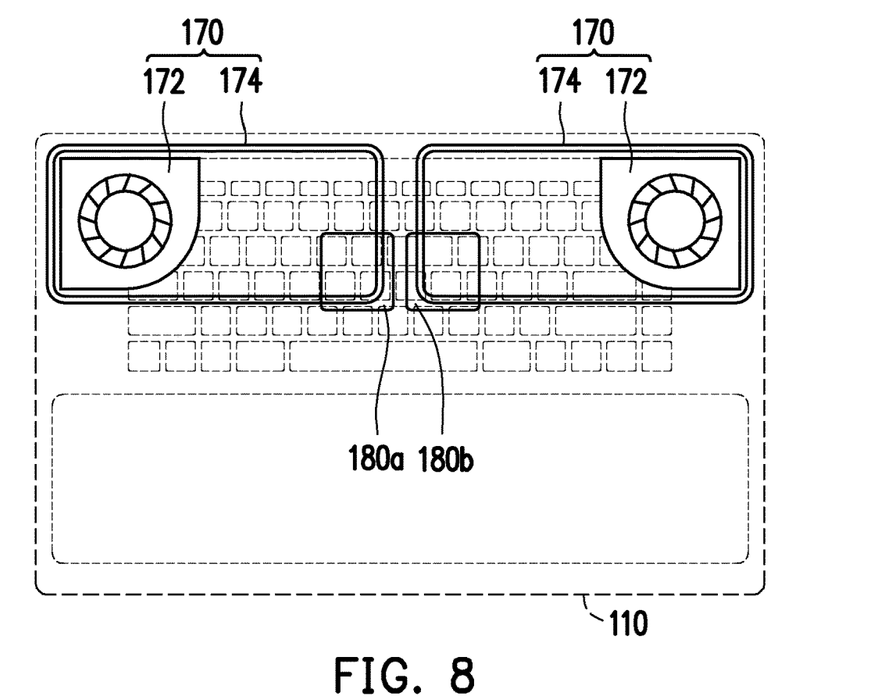
FIG. 8 is a schematic diagram of some members of the electronic device of FIG. 1.

FIG. 8 is a schematic diagram of some members of an electronic device of FIG. 1. Referring to FIG. 8, the electronic device 100 of the present embodiment may further include at least one heat-dissipation module 170 (two are shown in FIG. 8). The heat-dissipation module 170 includes a heat pipe 174 and a heat-dissipation fan 172, and is configured within a first body 110 to dissipate heat of heating elements 180a and 180b. The heating elements 180a and 180b are, for example, respectively a central processing unit (CPU) and a graphics processing unit (GPU). When the cover 160 is pushed to expose the positioning portion 110b as shown in FIG. 7A to FIG. 7C, an operating mode of the heat-dissipation module 170 is changed as being switched. Accordingly, an operating interface for controlling the switching is not required to be additionally displayed in the main display area 132a of the second body 130, to prevent picture information of the main display area 132a from being excessively cut or occupied. For example, the operating mode of the heat-dissipation module 170 may be changed from a general heat-dissipation mode to a strong heat-dissipation mode through the switching. Only one heat-dissipation fan 172 is enabled in the general heat-dissipation mode, and both heat-dissipation fans 172 are enabled in the strong heat-dissipation mode. Therefore, in the strong heat-dissipation mode during the drawing operation, the heating elements 180a and 180b can provide adequate heat-dissipation capability when generating relatively much thermal energy. For example, the switching is performed in this manner: the cover 160 is moved to trigger a switch that is disposed at an appropriate position of the first body 110, or performed in other manners, which is not limited in the disclosure.

Figure 9:
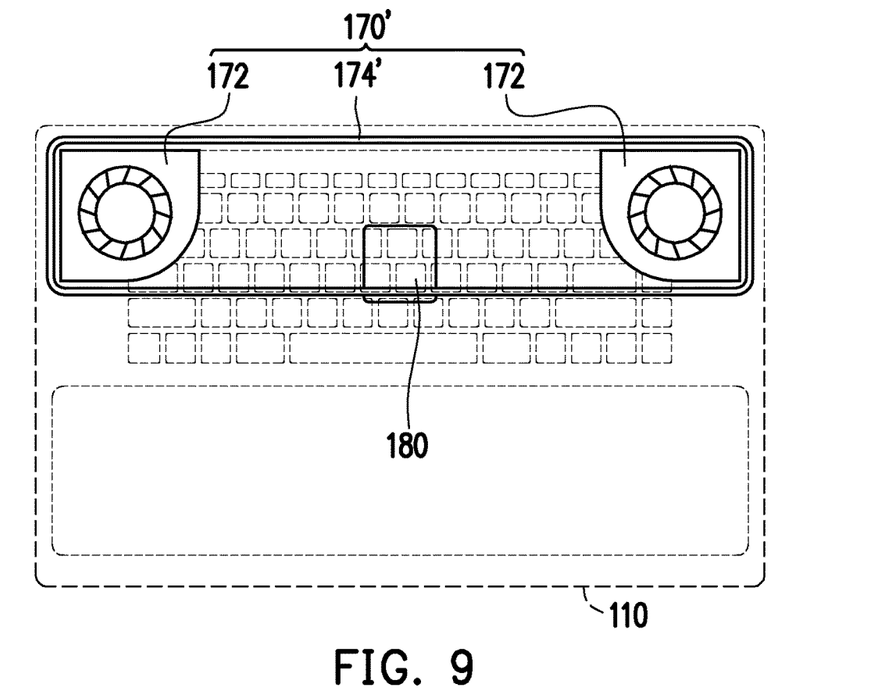
FIG. 9 is a schematic diagram of some members of an electronic device according to another embodiment of the disclosure.

FIG. 9 is a schematic diagram of some members of an electronic device according to another embodiment of the disclosure. A difference between an embodiment shown in FIG. 9 and an embodiment shown in FIG. 8 is that the heating elements 180a and 180b in FIG. 8 are integrated into a single heating element 180 in FIG. 9, and two heat pipes 174 in FIG. 8 are integrated into a single heat pipe 174' in a heat-dissipation module 170' of FIG. 9.

Based on the foregoing, in the electronic device of the disclosure, the second body has a notch corresponding to the first supporting member, and therefore the first supporting member may be fitted to the notch of the second body, and the thickness of the entire structure is not excessively increased due to disposing of the first supporting member. Further, the notch of the second body provides enough space to accommodate the first supporting member, so the thickness of the first supporting member may be at least equal to the thickness of the second body, and the thickness of the entire structure is not additionally increased. Accordingly, with the sufficient thickness, the first supporting member may have relatively favorable structure strength, and therefore the second supporting member, together with the first supporting member, can also provide enough supporting strength in the case where the thickness of the second supporting member is less than the thickness of the first supporting member. As a result, the entire structure has a relatively small thickness.

What is claimed is:

1. An electronic device, comprising: a first body;
a first supporting member comprising a first end and a second end that are opposite to each other, wherein the first end of the first supporting member is pivoted at the first body; and
a second body comprising a first notch, wherein the second end of the first supporting member is pivoted at the second body, and the first supporting member is adapted to be fitted to the first notch,
wherein the second body and the first supporting member that is fitted to the first notch are adapted to be closed or opened up with respect to the first body together as the first supporting member is pivotally rotated relative to the first body, and
wherein when the second body is opened up with respect to the first body, the second body and the first supporting member are adapted to be pivotally rotated relative to each other to separate the first supporting member from the first notch and move a bottom end of the second body to a preset position on the first body,
wherein the second body comprises a display surface, the display surface comprises a main display area and an auxiliary display area, and the auxiliary display area is connected to the first notch and extends along an edge of the main display area
wherein the display surface comprises a second notch that corresponds to the first notch of the second body.

2. The electronic device according to claim 1, wherein the second end of the first supporting member is pivoted at an inner edge of the first notch.

3. The electronic device according to claim 1, wherein the second body comprises a front face and a back face that are opposite to each other, and the first notch extends from the front face to the back face.

4. The electronic device according to claim 1, wherein the first end of the first supporting member is pivoted at a pivot of the first body, and when the first supporting member is fitted to the first notch, the bottom end of the second body adjoins the pivot.

5. The electronic device according to claim 1, comprising a second supporting member, wherein the second supporting member comprises a third end and a fourth end that are opposite to each other, the third end of the second supporting member is pivoted at the first body, the fourth end of the second supporting member is pivoted at the second body, the second body comprises a groove, the second supporting member is adapted to be fitted to the groove, and the second body and the second supporting member that is fitted to the groove are adapted to be closed and opened up with respect to the first body together as the second supporting member is pivotally rotated relative to the first body, and
wherein when the second body is opened up with respect to the first body, the second body and the second supporting member are adapted to be pivotally rotated relative to each other to separate the second supporting member from the groove and move the bottom end of the second body to the preset position.

6. The electronic device according to claim 5, wherein a thickness of the second supporting member is less than a thickness of the first supporting member.

7. The electronic device according to claim 1, wherein the second body comprises a side end, the side end is connected to the bottom end, and the first notch is formed at a corner of the second body and located between the side end and the bottom end.

8. The electronic device according to claim 1, wherein the first body comprises a positioning portion, and when the bottom end of the second body is located at the preset position, the bottom end is positioned at the positioning portion.

9. The electronic device according to claim 8, wherein the positioning portion comprises a slot, and the bottom end is adapted to be inserted into the slot.

10. The electronic device according to claim 9, comprising at least one engagement member, wherein the at least one engagement member is movably configured within the slot, the second body comprises at least one engagement slot at the bottom end, and the bottom end of the second body is adapted to stretch into the slot and abut against the at least one engagement member to drive the at least one engagement member to engage with the at least one engagement slot.

11. The electronic device according to claim 8, comprising a cover, wherein the cover is slidably disposed at the first body and covers the positioning portion, and the cover is adapted to be pushed to expose the positioning portion.

12. The electronic device according to claim 11, wherein the cover comprises a touch display interface.

13. The electronic device according to claim 12, wherein when the cover is pushed to expose the positioning portion, a display mode of the touch display interface changes.

14. The electronic device according to claim 11, comprising a heat-dissipation module, wherein the heat-dissipation module is configured within the first body, and when the cover is pushed to expose the positioning portion, an operating mode of the heat-dissipation module changes.

15. The electronic device according to claim 1, wherein the first supporting member comprises at least one electrical interface.

* * * * *